United States Patent
Ostrom et al.

[19]

[11] Patent Number: 5,926,123
[45] Date of Patent: Jul. 20, 1999

[54] SELF CALIBRATION CIRCUITRY AND ALGORITHM FOR MULTIPASS ANALOG TO DIGITAL CONVERTER INTERSTAGE GAIN CORRECTION

[75] Inventors: Kenneth A. Ostrom, Palos Verdes; Laura L. Carpenter, Los Angeles, both of Calif.

[73] Assignee: Raytheon Company, Lexington, Mass.

[21] Appl. No.: 08/986,942

[22] Filed: Dec. 8, 1997

[51] Int. Cl.⁶ .................................................. H03M 1/10
[52] U.S. Cl. ...................................... 341/120; 341/155
[58] Field of Search ................................. 341/120, 155, 341/121, 156, 161

[56] References Cited

U.S. PATENT DOCUMENTS

| | | | |
|---|---|---|---|
| 4,399,426 | 8/1983 | Tan | 341/155 |
| 4,947,168 | 8/1990 | Myers | 341/120 |
| 4,996,530 | 2/1991 | Hilton | 341/120 |

*Primary Examiner*—Brian Young
*Attorney, Agent, or Firm*—Leonard A. Alkov; William C. Schubert; Glenn H. Lenzen, Jr.

[57] ABSTRACT

Autocalibration circuitry and an algorithm (method) for aligning interstage gain within a high resolution multipass analog-to-digital converter. The interstage gain alignment technique maximizes the signal-to-noise ratio and spurious free dynamic range of the multipass analog-to-digital converter. The multipass analog-to-digital converter uses an m-bit course analog-to-digital converter and an n-bit fine analog-to-digital converter whose input is derived from an m-bit digital-to-analog converter. Output words of the course and fine analog-to-digital converters are combined to produce an output word of the multipass analog-to-digital converter. The present invention applies a random signal into the m-bit digital-to-analog converter. The digital output of the n-bit fine analog-to-digital converter is statistically examined to discern the gain misalignment error. The sign of the gain misalignment error is correlated with the sign of the random signal applied to the m-bit digital-to-analog converter to null the gain error independently of the input signal sampled by the multipass analog-to-digital converter and without interrupting the conversion process of the multipass analog-to-digital converter. The present invention thus utilizes statistical averaging of the product of the error term that is minimized and a pseudo random signal in the digital domain without interrupting the analog-to-digital conversion process. This provides for continuous optimization of the interstage gain, thereby compensating for errors related to temperature, aging and other environmental factors that cannot be achieved using traditional laser trim techniques, for example.

11 Claims, 4 Drawing Sheets

SELF CALIBRATION CIRCUITRY AND ALGORITHM FOR MULTIPASS ANALOG TO DIGITAL CONVERTER INTERSTAGE GAIN CORRECTION

BACKGROUND

The present invention relates generally to analog-to-digital converters and self calibration algorithms, and more particularly, to autocalibration circuitry and algorithm for aligning interstage gain in a high resolution multipass analog-to-digital converter.

Prior art relating to the present invention include U.S. Pat. No. 4,947,168 entitled "Subranging Analog-to-Digital Converter with Calibration, assigned to the assignee of the present invention. This analog-to-digital converter requires external precision references and analog multiplexers, programmable micro-controller function with memory. Also, the technique interrupts the analog-to-digital conversion process requiring a dedicated calibration time during which normal converter operation is suspended.

U.S. Pat. No. 4,399,426 entitled "On Board Self-Calibration of Analog-to-Digital and Digital-to-Analog Converters" discloses charge-redistributed circuit implementations of analog-to-digital converters, and does not address interstage gain alignment addressed by the present invention. U.S. Pat. No. 4,996,530 entitled "Statistically Based Continuous Autocalibration Method and Apparatus" discloses autocalibration of subranging analog-to-digital converters internal digital-to-analog-converter and does not address autocalibration of the interstage gain error.

Accordingly, it is an objective of the present invention to provide for autocalibration circuitry and algorithm for aligning interstage gain in a high resolution multipass analog-to-digital converter.

SUMMARY OF THE INVENTION

To accomplish the above and other objectives, the present invention provides for autocalibration circuitry and an algorithm (method) that may be used to align interstage gain in a high resolution multipass analog-to-digital converter. The interstage gain alignment maximizes the signal-to-noise ratio and spurious free dynamic range of the analog-to-digital converter. The circuitry and algorithm utilize statistical averaging of the product of the error term that is minimized and a pseudo random signal in the digital domain without interrupting the analog-to-digital conversion process. This provides for continuous optimization of the interstage gain, thereby compensating for errors related to temperature, aging and other environmental factors that cannot be achieved using traditional laser trim techniques, for example.

More specifically, the present technique aligns the interstage gain within a high resolution multipass analog-to-digital converter employing an m-bit course analog-to-digital converter and an n-bit fine analog-to-digital converter whose input is derived from an m-bit digital-to-analog converter and wherein the output words of the course and fine analog-to-digital converters are combined to produce an output word of the multipass analog-to-digital converter. The technique comprises the steps of applying a random signal into the m-bit digital-to-analog converter. The digital output of the n-bit fine analog-to-digital converter is statistically examined to discern the gain misalignment error. The sign of the gain misalignment error is correlated with the sign of the random signal applied to the m-bit digital-to-analog converter to null the gain error independently of the input signal sampled by the multipass analog-to-digital converter and without interrupting the conversion process of the multipass analog-to-digital converter.

The autocalibration circuitry and algorithm (method) continuously and accurately aligns the interstage gain of the multipass analog-to-digital converter to maximize the signal-to-noise ratio and spurious free dynamic range thereof. The self calibration circuitry and algorithm eliminates the need for adjustment either by laser trimming of a resistor or other method during manufacture of the analog-to-digital converter, which minimizes production costs. The self calibration circuitry and algorithm also compensates for errors related to temperature, aging and other environmental factors which can not be achieved using traditional laser trim techniques.

The autocalibration function provided by the present invention is continuous and transparent to the user of the analog-to-digital converter. The autocalibration function does not interrupt the analog-to-digital converter conversion process nor does it require a separate calibration cycle. The majority of the autocalibration circuitry is digital and adds minimal analog complexity to the analog-to-digital converter function. In a reduced-to-practice embodiment of the present invention, the autocalibration circuitry was monolithically integrated with the analog-to-digital converter circuit function and requires no off-chip components or precision references.

The present invention may be used in military and commercial applications. The present invention provides for at least a ten times reduction in manufacturing cost and at least a four times increase in dynamic performance of state-of-the-art analog-to-digital converters by eliminating the need and limitations of manual trimming while enabling the use of low cost electronic packaging.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
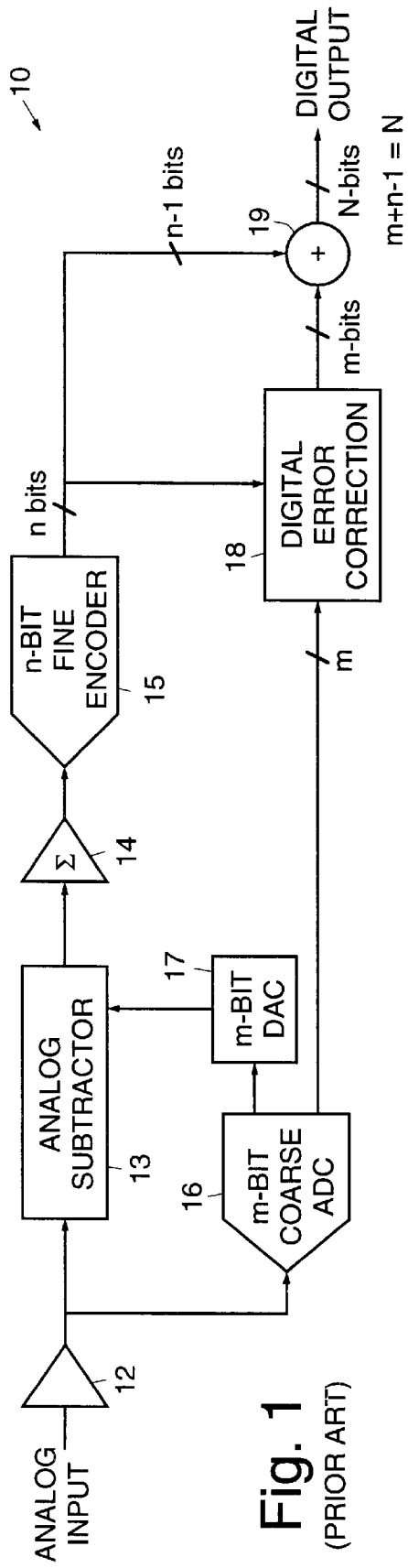
FIG. 1 is a block diagram illustrating a typical conventional subranging two-pass N-bit analog-to-digital converter.

Referring to the drawing figures, a block diagram of a typical conventional subranging two-pass N-bit analog-todigital converter (ADC) 10 is shown in FIG. 1. This conventional analog-to-digital converter 10 includes a sample-and-hold circuit 12, an m-bit coarse analog-to-digital converter 16, an n-bit fine analog-to-digital converter 15, a precision m-bit digital-to-analog converter (DAC) 17, an analog subtraction circuit 13, an amplifier 14 with gain A, a digital error correction circuit 18 and a digital summation circuit 19, interconnected as shown. The overall resolution N of the analog-to-digital converter 10 is equal to (m+n−1).

The analog-to-digital converter 10 operates as follows. An analog input signal is sampled by the sample-and-hold circuit 12. The held sample is then encoded to m-bits of resolution by the an m-bit coarse analog-to-digital converter 16 which drives the precision m-bit digital-to-analog converter 17, and whose output is subtracted from the sampled and held output voltage using the analog subtraction circuit 13. The resulting residue signal is then amplified by the amplifier 14 having gain A and encoded to n-bits of resolution by the n-bit fine analog-to-digital converter 15.

A conventional digital error correction scheme is used to sum or combine the coarse and fine words, whereby the lower n−1 bits of the n-bit fine analog-to-digital converter 15 are used directly as the n−1 least significant bits of the N-bit output word. If the most significant bit (MSB) of the fine analog-to-digital converter 15 is a "1" then the m-bit word from the m-bit coarse analog-to-digital converter 16 is directly used as the "m" most significant bits of the N-bit output word. If the most significant bit of the fine analog-to-digital converter 15 is a "0" then "one" is subtracted from the m-bit coarse word with the resultant used as the "m" most significant bits of the N-bit output word.

The conventional digital error correction scheme compensates for gain and offset errors between the coarse and fine analog-to-digital converters 16, 15 but does not compensate for gain misalignment between the precision m-bit digital-to-analog converter 17 and the n-bit fine analog-to-digital converter 15, which degrades the integral nonlinearity of the N-bit analog-to-digital converter 10. The advantage of the subranging approach is that the accuracy of the N-bit analog-to-digital converter 10 is a function of the m-bit digital-to-analog converter 17 and the n-bit fine analog-to-digital converter 15 and not dependent on the accuracy of the m-bit coarse analog-to-digital converter 16.

The relationship between the precision m-bit digital-to-analog converter 17 and the fine analog-to-digital converter 15 to optimize the integral nonlinearity of the N-bit analog-to-digital converter 10 can be simplified to the following expression:

$$(Id)(R)(A) = Q(2^{(n-1)})$$

where Id is the incremental change in the output current of the digital-to-analog converter 17 corresponding to a one code change in the digital input word to the m-bit digital-to-analog converter 17, R is the transimpedance of the analog subtraction circuit 13, A is the gain of the summing amplifier 14, Q is the quantization level of the n-bit fine analog-to-digital converter 15 and overall N-bit analog-to-digital converter 10, and n is the resolution of the fine analog-to-digital converter 15 in bits. If $Id*R*A \neq Q*2^{(n-1)}$ then a sawtooth error deviation from ideal linear performance will emerge in the transfer function of the N-bit analog-to-digital converter 10 which results in a degradation in both signal-to-noise ratio and spurious free dynamic range performance.

Care can be taken in the design of the analog-to-digital converter 10 to minimize mismatch between the two terms, however finite statistical process variations limit the accuracy that is achieved. Higher accuracy can be achieved by laser trimming a resistor that independently adjusts the gain or Q of the fine analog-to-digital converter 15 to null the sawtooth error. However, such custom trimming significantly increases the cost of the fine analog-to-digital converter 15 and is thus unsuitable for many applications. In addition, component errors related to temperature, aging and other factors cannot be nulled by a one-time laser trimming operation.

Figure 2:
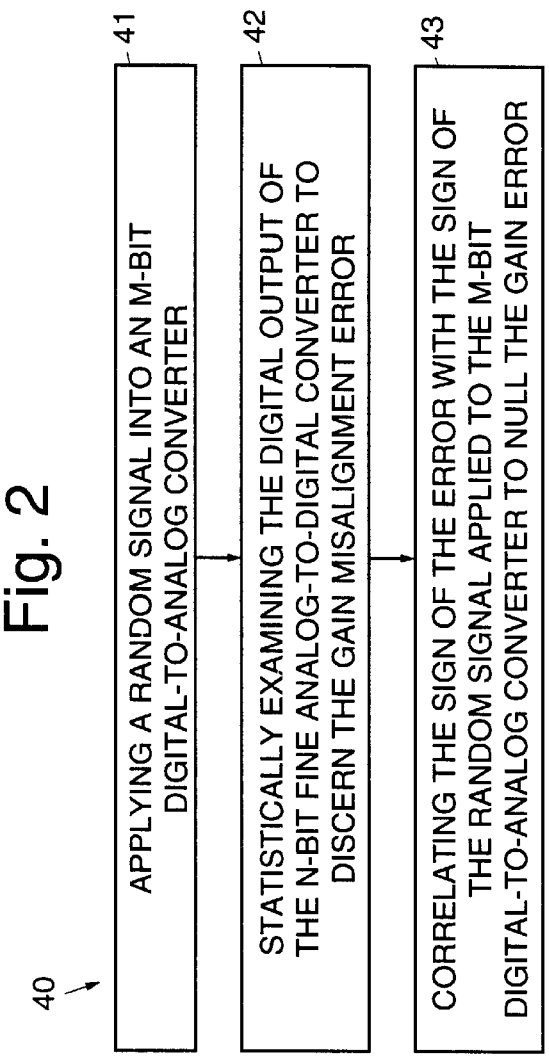
FIG. 2 is a flow diagram illustrating an exemplary autocalibration method in accordance with the principles of the present invention.

To overcome these limitations, the present invention provides a technique whereby gain alignment between the precision m-bit digital-to-analog converter 17 and the n-bit fine analog-to-digital converter 15 is continuously monitored and aligned. FIG. 2 is a flow diagram illustrating an exemplary autocalibration method 40 in accordance with the principles of the present invention. The autocalibration method 40 is implemented by introducing or applying 41 a random signal into the m-bit digital-to-analog converter 17, statistically examining 42 the digital output of the n-bit fine analog-to-digital converter 15 to discern the gain misalignment error, and correlating 43 the sign of the error with the sign of the random signal applied to the m-bit digital-to-analog converter 17 to null the gain error independently of the input signal sampled by N-bit analog-to-digital converter 10 and without interrupting the normal conversion process of the N-bit analog-to-digital converter 10.

Figure 3:
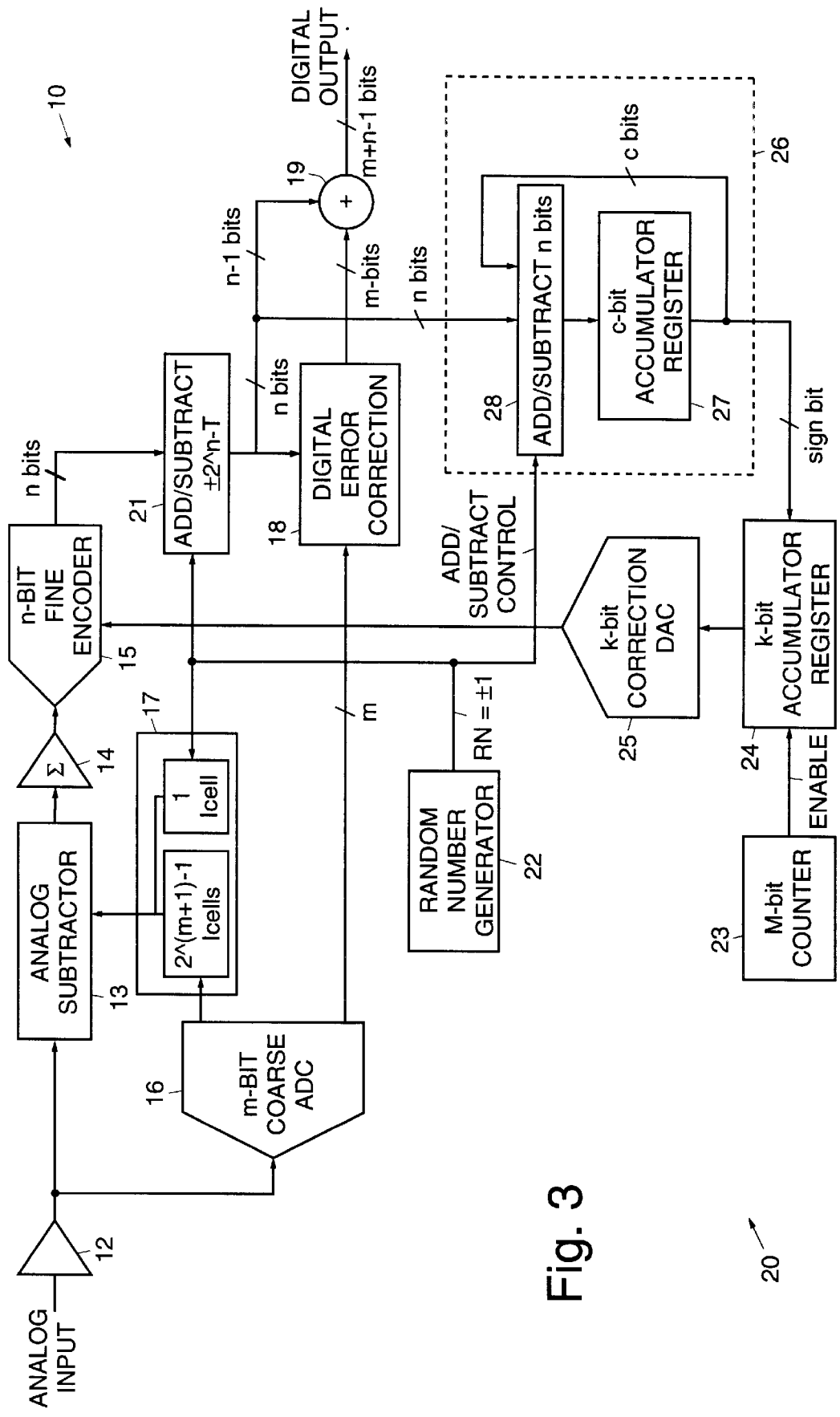
FIG. 3 is a block diagram illustrating an analog-to-digital converter employing a first embodiment of autocalibration circuitry and method in accordance with the principles of the present invention.

A block diagram of a subranging two-pass N-bit analog-to-digital converter 10 employing a first embodiment of autocalibration circuitry 20 and method 40 in accordance with the principles of the present invention is shown in FIG. 3. The subranging two-pass N-bit analog-to-digital converter 10 includes a sample-and-hold circuit 12, an m-bit coarse analog-to-digital converter 16, an n-bit fine analog-to-digital converter 15, an m-bit digital-to-analog converter 17, an analog subtraction circuit 13, an amplifier 14 and a digital summation circuit 19. The resolution N of the overall analog-to-digital converter 10 is equal to (n+m−1).

In addition, the analog-to-digital converter 10 includes autocalibration circuitry 20 comprising an add/subtract circuit 21, an M-bit counter 23, a k-bit accumulator register 24, a c-bit accumulator 26, a k-bit correction digital-to-analog converter 25 and a random number generator 22, interconnected as shown in FIG. 3. The m-bit digital-to-analog converter 17 has been modified in accordance with the present invention to include $2^{(m+1)}$ current cells of nominal value Icell, whereby the incremental change in the output current of the digital-to-analog converter 17 corresponding to a one code change in the digital input word to the m-bit digital-to-analog converter 17 is ideally 2*Icell. The $2^{(m+1)}-1$ cells are controlled by the digital output word of the m-bit coarse analog-to-digital converter 16 and one Icell is controlled by the random number generator 22. For convenience, the output of the N-bit digital-to-analog converter 10 is described in terms of a current, and the output of the sample-and-hold circuit 12 is described in terms of a voltage, however, other embodiments whereby signals within the digital-to-analog converter 10 are either a voltage or current may be readily implemented.

The operation of the present invention in the context of the 2-pass N-bit subranging analog-to-digital converter 10 is as follows. The M-bit counter 23 and c-bit accumulator 26 are initially reset, and the analog input signal is sampled by the sample-and-hold circuit 12. The held sample is then encoded to m-bits of resolution by the m-bit coarse analog-to-digital converter 16 which drives the precision m-bit digital-to-analog converter 17 whose output is subtracted from the sampled and held output voltage using the analog subtraction circuit 13. The output of the precision m-bit digital-to-analog converter 17 also contains a term equal to RN*Icell where RN is the random number output of the random number generator 22 and is either +1 or −1. The resulting residue is then amplified using the amplifier 14 having gain A and is encoded to n-bits of resolution using the n-bit fine analog-to-digital converter 15. The digital word output by the n-bit fine analog-to-digital converter 15 is passed through the add/subtract circuit 21 which either adds or subtracts $2^{n-T}$ based on the value of the random number RN. If the random number RN is equal to +1, then the add/subtract circuit 21 digitally adds $2^{n-T}$ to the n-bit fine word to form a corrected fine word. Similarly, if the random number RN is equal to −1, then the add/subtract circuit 21 digitally subtracts $2^{n-T}$ from the n-bit fine word. The corrected fine word is presented to both the conventional digital error correction circuit 18 and a c-bit digital accumulator 26.

A conventional digital error correction scheme is used to sum or combine the coarse and corrected fine words as described above to form a N-bit ADC word. The c-bit digital accumulator 26 adds 28 or subtracts 28 the corrected fine word from the prior held output of the c-bit digital accumulator 26 which is the accumulation of all prior fine word samples since being reset or zeroed. This process continues until the M-bit counter 23 reaches terminal count, which corresponds to $2^{m-1}$ samples. At that time the output of the c-bit accumulator 26 is examined and if found to have a net positive change in value (MSB=1) then the k-bit accumulator register 24 is incremented by "one" thereby incrementing the k-bit correction digital-to-analog converter 25 and increasing the gain of the fine analog-to-digital converter 15. Similarly, if the c-bit accumulator 26 is found to have a net negative change in value (MSB=0) then the k-bit accumulator register 27 is decremented by "one" thereby decrementing the k-bit correction digital-to-analog converter 25 and decreasing the gain of the fine analog-to-digital converter 15. The M-bit counter 23 and c-bit accumulator 26 are then reset and the process of accumulating residue samples begins again until the M-bit counter 23 reaches terminal count and the c-bit accumulator 26 is reexamined to determine if the correction digital-to-analog converter 25 should be incremented or decremented.

The output of the c-bit accumulator 26 which is proportional to the fine gain error can be expressed for any given sample x by:

$$E_x = k\Sigma((A)(V_x)RN_x/Q + (Icell)(R)(A)RN_x/Q - 2^{n-T}RN_x),$$

where $E_x$ is the output of the c-bit accumulator 26, k is a constant, $V_x$ is the output of the analog subtraction circuit 13, $RN_x$ is the output of the random number generator 22 which is either +1 or −1, Icell is the incremental change in the output current of the digital-to-analog converter 17 independently controlled by $RN_x$ and approximately equal to all other digital-to-analog converter cells which form the composite transfer function of the digital-to-analog converter 10, R is the transimpedance of the analog subtraction circuit 13, A is the gain of the summing amplifier 14, Q is the quantization level of the n-bit fine analog-to-digital converter 15, and T is a design parameter chosen such that the gain error is nominally nulled when $(Icell)(R)(A)/Q = 2^{n-T}$.

The self-calibration algorithm 40 or method 40 implemented in the analog-to-digital converter 10 relies on the fact that the random number ($RN_x$) and the input signal that is quantized by the analog-to-digital converter 10 (represented by $V_x$ at the output of the analog subtraction circuit 13) are statistically uncorrelated. Given that the random number RN is either +1 or −1 for any given sample, with either state having equal probability density, the long term average of the random number RN is approximately zero. Therefore, the magnitude of the output of the accumulator 26 related to the product of the sampled input signal ($V_x$) and $RN_x$ decreases and approaches zero over the long term if many samples are averaged. Conversely, the DAC cell (Icell) and the add/subtract circuit 21 are directly controlled by the random number RN and are therefore statistically correlated to RN. Therefore, the output of the c-bit accumulator 26 contains information which is directly related the value of the DAC cell and the gain of the fine analog-to-digital converter 15 and whose magnitude increases over the long term as represented by the terms $((Icell)(R)(A)RN_x/Q - 2^{n-T}RN_x)$ in the prior expression. The value of M is chosen such that a sufficient number of samples are accumulated to readily discern the gain alignment error between the digital-to-analog converter 17 and the fine analog-to-digital converter 15 independently of the input signal sampled by the N-bit analog-to-digital converter 10 and without interrupting or disturbing the conversion process of the analog-to-digital converter 10.

Figure 5:
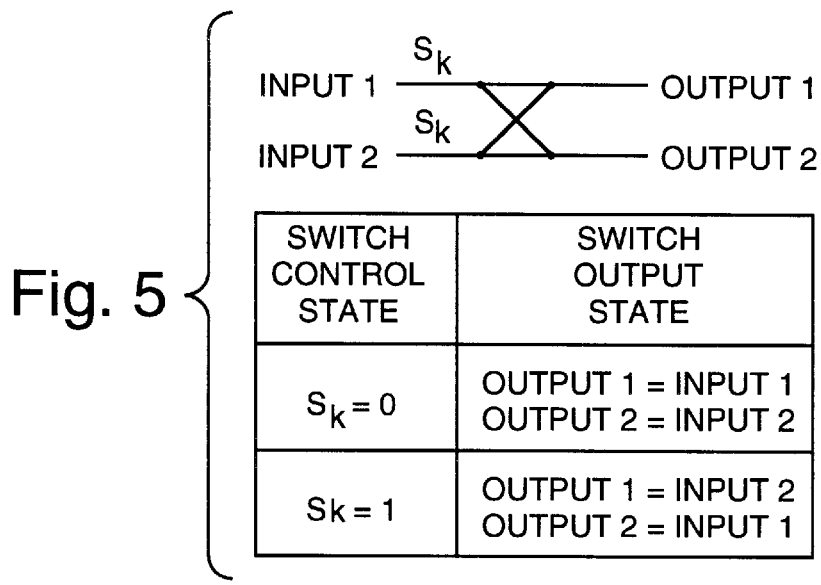
FIG. 5 is a block diagram illustrating a basic digital swapper cell and associated logical truth table in accordance with the principles of the present invention.

The m-bit digital-to-analog converter 17 includes $2^{(m+1)}$ current cells of nominal value Icell. However, statistical process variations which affect transistor and resistor matching will result in variations of the absolute magnitude of each DAC cell which in turn will effect the accuracy of the self calibration gain algorithm 40 since the chosen Icell controlled by the random number RN for the purpose of gain calibration may not represent the average value of all DAC cells of the digital-to-analog converter 17. The accuracy of the gain alignment can be improved during the gain calibration process if the Icell controlled by the random number generator 22 is randomly or systematically swapped with one of the $2^{(m+1)}-1$ Icells controlled by the digital output word of the m-bit coarse analog-to-digital converter 16. A basic digital swapper cell and associated logical truth table is illustrated in FIG. 5.

Figure 6:
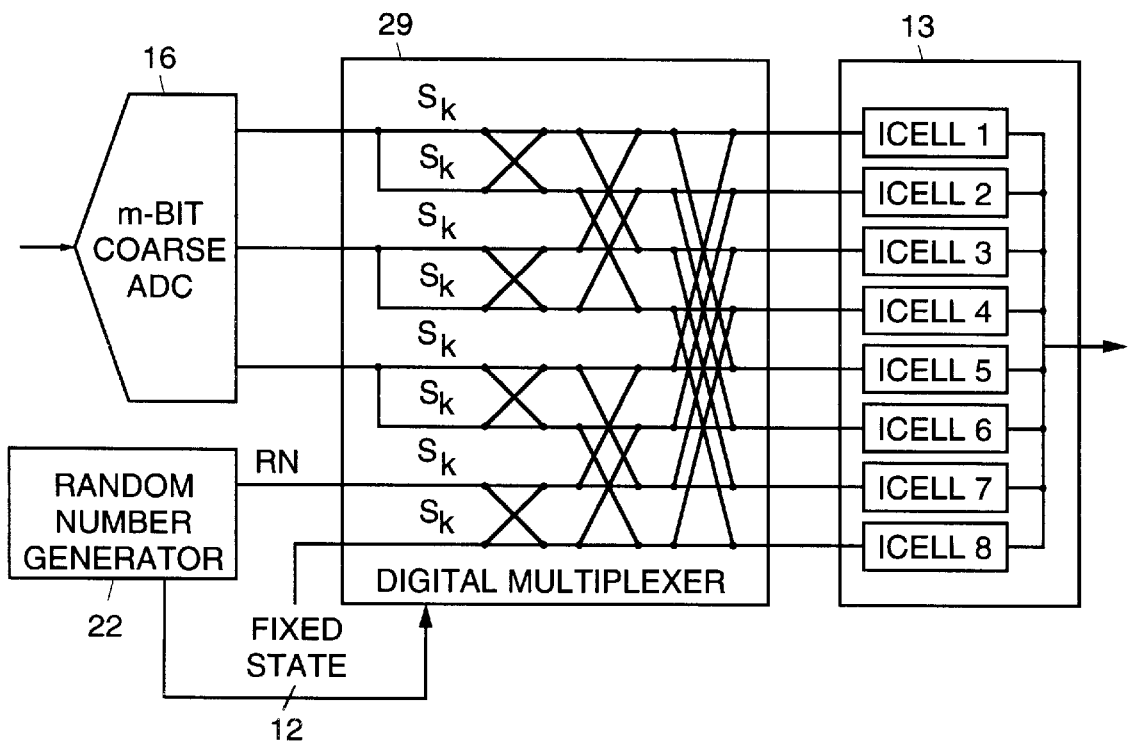
FIG. 6 is a block diagram illustrating an example of digital swapping of the digital-to-analog converter associated unit weight cells in accordance with the principles of the present invention.

In a preferred embodiment of the present invention, the swapping or dynamic addressing is accomplished in the digital domain using a digital multiplexer 29 (FIG. 6) such that over time each of the $2^{(m+1)}$ Icells will be used uniformly during the self calibration cycle thereby achieving a statistical average of all the DAC cells ($Icell_{avg}$) as the basis for gain optimization. A block diagram illustrating an example of digital swapping of the digital-to-analog converter 13 associated unit weight cells in relation to the m-bit coarse analog-to-digital converter 16 digital output bits and random number generator 22 output RN is shown in FIG. 6 for the illustrative case of m=2. Further embodiments of the swapper logic for the purposes of improving the accuracy of the gain calibration for arbitrary choices of m may be readily construed from the example of FIG. 6. The state of the digital multiplexer 29 is controlled by the random number generator 23. The gain error is then nulled when $(Icell_{avg})(R)(A)/Q = 2^{n-T}$. In a generalized embodiment, any subset of DAC Icells may be averaged, thereby trading complexity of the digital multiplexer 29 for accuracy of the Icell average.

Figure 4:
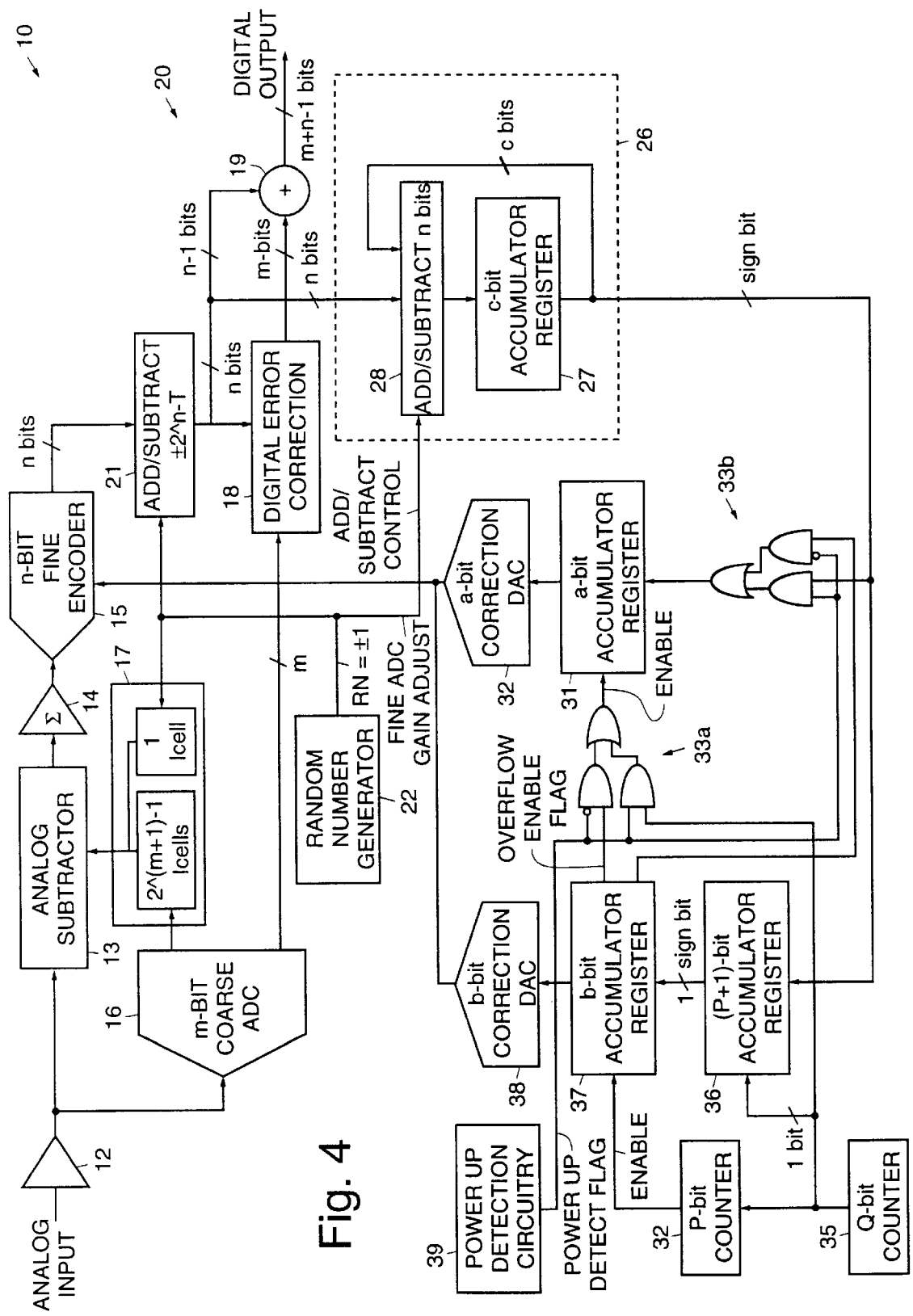
FIG. 4 is a block diagram illustrating an analog-to-digital converter employing a second embodiment of autocalibration circuitry and method in accordance with the principles of the present invention.

A further refinement of the present invention is shown in FIG. 4. In this alternative embodiment of the analog-to-digital converter 10, the k-bit correction digital-to-analog converter 25 is partitioned into first and second digital-to-analog converters 32, 38. The first digital-to-analog converter 32 has a resolution of a-bits, the second digital-to-analog converter 38 has a resolution of b-bits, and the a-bit and b-bit correction digital-to-analog converters 32, 38 have a-bit and b-bit accumulator registers 31, 37 respectively. The M-bit counter 23 is partitioned into two counters 32, 35. The first counter 32 has a resolution of P-bits, and the second counter 35 has a resolution of Q-bits, whereby k=a+b−1, and M=P+Q. A power up detect circuit 39 along with two logic circuits 33a, 33b coupled to the respective accumulator registers 31, 37 senses power applied to the analog-to-digital converter 10. The output current controlled by the most significant bit (MSB) of the b-bit digital-to-analog converter 38 is approximately equal to the output current controlled by the least significant bit (LSB) of the a-bit digital-to-analog converter 32 such that the composite transfer function of the first and second digital-to-analog converters 32, 38 are overlapped by 1-bit. Additionally, the output Q of the second counter 35 is derived from the output of the P counter 32 such that the effective counter range is M or P+Q.

Operation of the analog-to-digital converter 10 shown in FIG. 4 is essentially the same as that of FIG. 3 embodiment with the following differences. The power up detect circuit 39 senses the initial application of power to the analog-to-digital converter 10 and sets a power-up detect flag that stays active for $2^{(P+Q)}$ ADC samples, resets all calibration registers and accumulators and enables the a-bit accumulator register 31 using the logic circuits 33a, 33b. When $2^Q$ samples have been counted by the Q-bit counter 35, the output of the c-bit accumulator 26 is examined and if found to have a net positive change in value (MSB=1) then the a-bit accumulator register 31 is incremented by "one" thereby incrementing the a-bit correction digital-to-analog converter 32 and increasing the gain of the fine analog-to-digital converter 15. Similarly, If the c-bit accumulator 26 is found to have a net negative change in value (MSB=0) then the a-bit accumulator register 31 is decremented by "one" thereby decrementing the a-bit correction digital-to-analog converter 32 and decreasing the gain of the fine analog-to-digital converter 15. The Q-bit counter and c-bit accumulator are then reset while the P-bit counter is incremented by "one", and the process of accumulating samples begins again until the Q-bit counter again reaches terminal count and the c-bit accumulator 26 is reexamined to determine if the a-bit correction digital-to-analog converter 32 should be incremented or decremented. This process continues until the P-bit counter 32 reaches terminal count which results in the power-up detect flag being reset. At this point, the correction loop has attained coarse convergence after only $2^{(Q+a+1)}$ ADC samples.

Next, the (P+1) bit accumulator register 36 is used to average $2^P$ samples of the c-bit accumulator 26 where each c-bit accumulator sample is the result of $2^Q$ ADC samples. This averaging is performed to improve the signal-to-noise ratio of the error signal for fine loop convergence. When $2^{(P+Q)-}$ samples have been counted by the P-bit and Q-bit counters 33, 35, the output of the (P+1) bit accumulator register 36 is examined and if found to have a net positive change in value (MSB=1) then the b-bit accumulator register 37 is incremented by "one" thereby incrementing the b-bit correction digital-to-analog converter 32 and increasing the gain of the fine analog-to-digital converter 15. Similarly, If the (P+1) bit accumulator is register 36 found to have a net negative change in value (MSB=0) then the b-bit accumulator register 37 is decremented by "one" thereby decrementing the b-bit correction digital-to-analog converter 38 and decreasing the gain of the fine analog-to-digital converter 15. The P-bit counter 32, Q-bit counter 25, and (P+1) bit and c-bit accumulator registers 36, 27 are then reset and the process of accumulating samples with the c-bit and (P+1) bit accumulator registers 36, 27 begins again until the P-bit and Q-bit counters 32, 38 again reach terminal count and the (P+1) bit accumulator register 36 is reexamined to determine if the b-bit correction digital-to-analog converter 32 should be incremented or decremented. In the absence of environmental changes, the correction loop will attain fine convergence after $2^{(P+Q+b-1)}$ ADC samples.

If, in the event that the b-bit accumulator register 37 and b-bit correction digital-to-analog converter 32 are driven to an overflow or underflow condition, the overflow enable flag is enabled and the overflow increment/decrement flag is appropriately set to indicate either an overflow or underflow condition as shown in FIG. 4. The b-bit correction digital-to-analog converter 38 and b-bit accumulator register 37 are then reset to a mid-scale condition, while the a-bit correction digital-to-analog converter 32 and a-bit accumulator register 31 are appropriately incremented or decremented based on the state of the overflow increment/decrement flag. Loop control is then returned to the (P+1) bit and b-bit accumulator registers 36, 37 and b-bit digital-to-analog converter 38 as previously described to attain reconvergence of the fine loop.

The dual correction digital-to-analog converter 32, 38 configuration just described provides two advantages over the single correction digital-to-analog converter 25 implementation of FIG. 3. The first is that loop convergence is improved by nearly a factor of $2^a$ ADC samples. Secondly, since the first and second correction digital-to-analog converters 32, 38 are overlapped by 1-bit the required accuracy to achieve an overall monotonic correction transfer function is relaxed by a factor of either $2^a$ or $2^b$ which ever is smaller.

In a further broadening of scope, the present invention may also be applied to analog-to-digital converter architectures beyond the simple two-pass architecture structure with one bit of error correction overlap illustrated in FIGS. 1, 2 and 3. The principles of the present invention may be applied to analog-to-digital converters with greater or less than one-bit of digital error correction. The principles of the present invention may also be applied to analog-to-digital converters with a multiplicity of stages or passes. In addition, the principles of the present invention can be applied to any other application where precision gain alignment between a digital-to-analog converter and a quantizing element (or analog-to-digital converter) is desired.

For example, the present invention may be used in a circuit having an m-bit digital-to-analog converter 17 and an n-bit analog-to-digital converter 15 whose input is derived from the m-bit digital-to-analog converter. The present invention provides for autocalibration circuitry 20 for aligning gain of the m-bit digital-to-analog converter to the n-bit analog-to-digital converter. The autocalibration circuitry 20 comprises a number generator 22 for applying a signal to the m-bit digital-to-analog converter 17 which is statistically uncorrelated to a second signal applied to the m-bit digital-to-analog converter 17. An accumulator 26 is provided for statistically examining the output of the n-bit analog-to-digital converter 15 to discern the gain misalignment error, and for correlating the sign of the gain misalignment error with the sign of the signal from the number generator 22 applied to the m-bit digital-to-analog converter 17 to null the gain error independently of the signal applied to the m-bit digital-to-analog converter 17. The gain alignment is accomplished without interrupting the conversion process of the m-bit digital-to-analog converter 17 and n-bit analog-to-digital converter 15.

Thus, autocalibration circuitry and an algorithm for aligning interstage gain within a high resolution multipass analog-to-digital converter have been disclosed. It is to be understood that the described embodiments are merely illustrative of some of the many specific embodiments that represent applications of the principles of the present invention. Clearly, numerous and other arrangements can be readily devised by those skilled in the art without departing from the scope of the invention.

What is claimed is:

1. In a circuit comprising an m-bit digital-to-analog converter and an n-bit analog-to-digital converter whose input is derived from the m-bit digital-to-analog converter, autocalibration circuitry for aligning gain of the m-bit digital-to-analog converter to the n-bit analog-to-digital converter comprising:

a number generator for applying a signal to the m-bit digital-to-analog converter which is statistically uncorrelated to a second signal applied to the m-bit digital-to-analog converter; and an accumulator for statistically examining the output of the n-bit analog-to-digital converter to discern the gain misalignment error, and for correlating the sign of the gain misalignment error with the sign of the signal from the number generator applied to the m-bit digital-to-analog converter to null the gain error independently of the signal applied to the m-bit digital-to-analog converter and without interrupting the conversion process of the m-bit digital-to-analog converter and n-bit analog-to-digital converter.

2. The autocalibration circuitry of claim 1 wherein the accumulator comprises an addition/subtraction circuit and a c-bit accumulator register.

3. The autocalibration circuitry of claim 1 wherein the m-bit digital-to-analog converter comprises $2^{(m+1)}$ current cells of nominal value Icell, and wherein $2^{(m+1)}-1$ cells are controlled by the digital output word of an m-bit coarse analog-to-digital converter and one Icell is controlled by the random number generator.

4. The autocalibration circuitry of claim 1 wherein the number generator comprises a random number generator, and wherein the accumulator correlates the sign of the gain misalignment error with the sign of the random signal applied to the m-bit digital-to-analog converter to null the gain error.

5. The autocalibration circuitry of claim 4 wherein the accumulator comprises an addition/subtraction circuit and a c-bit accumulator register.

6. The autocalibration circuitry of claim 5 further comprising:

a k-bit accumulator register coupled to the c-bit accumulator register;

an M-bit counter coupled to the k-bit accumulator register; and a k-bit correction digital-to-analog converter coupled between the k-bit accumulator register and the n-bit fine analog-to-digital converter.

7. The autocalibration circuitry of claim 4 wherein the m-bit digital-to-analog converter comprises $2^{(m+1)}$ current cells of nominal value Icell, and wherein $2^{(m+1)}-1$ cells are controlled by the digital output word of the m-bit coarse analog-to-digital converter and one Icell is controlled by the random number generator.

8. The autocalibration circuitry of claim 3 further comprising:

a digital multiplexer coupled to outputs of the m-bit coarse analog-to-digital converter, to the output of the random number generator, and to selected cells of the m-bit digital-to-analog converter for dynamic addressing and statistically averaging the cells to provide for gain optimization.

9. In a circuit comprising an m-bit digital-to-analog converter and an n-bit analog-to-digital converter whose input is derived from the m-bit analog-to-digital converter, a method for aligning gain of the m-bit digital-to-analog converter to the n-bit analog-to-digital converter, said method comprising the steps of:

applying a signal to the m-bit digital-to-analog converter which is statistically uncorrelated to a second signal applied to the m-bit digital-to-analog converter;

statistically examining the output of the n-bit fine analog-to-digital converter to discern the gain misalignment error; and correlating the sign of the gain misalignment error with the sign of the signal from the number generator applied to the m-bit digital-to-analog converter to null the gain error independently of the signal applied to the m-bit digital-to-analog converter and without interrupting the conversion process of the m-bit digital-to-analog converter and n-bit analog-to-digital converter.

10. The method of claim 9 wherein the applying step comprises the step of applying a random signal to the m-bit digital-to-analog converter, and wherein the correlating step comprises the step of correlating the sign of the gain misalignment error with the sign of the random signal applied to the m-bit digital-to-analog converter to null the gain error.

11. A method for aligning interstage gain within a high resolution multipass analog-to-digital converter comprising a sample-and-hold circuit, and analog subtraction circuit coupled to the sample-and-hold circuit, an m-bit course analog-to-digital converter and an n-bit fine analog-to-digital converter whose input is derived from an m-bit digital-to-analog converter and wherein the output words of the course and fine analog-to-digital converters are combined to produce an output word of the multipass analog-to-digital converter, a random number generator for outputting a random number equal to +1 or −1 to the m-bit digital-to-analog converter, a c-bit accumulator for statistically examining the digital output of the n-bit fine analog-to-digital converter, and an M-bit counter for enabling said method comprising the steps of:

initially resetting the M-bit counter and c-bit accumulator;

sampling the analog input signal using the sample-and-hold circuit;

encoding the held sample to m-bits of resolution using the m-bit coarse analog-to-digital converter;

subtracting the output of the m-bit digital-to-analog converter from the sampled and held output voltage using the analog subtraction circuit;

amplifying the residue derived from subtraction;

encoding the amplified residue to n-bits of resolution using the n-bit fine analog-to-digital converter;

adding or subtracting $2^{n-T}$ to the digital word output by the n-bit fine analog-to-digital converter based on the value of the random number, such that if the random number is equal to +1, then $2^{n-T}$ is added to the n-bit fine word to form a corrected fine word, and if the random number is equal to −1, $2^{n-T}$ is subtracted from the n-bit fine word;

summing the coarse and corrected fine words to form a composite N-bit word;

adding or subtracting the corrected fine word from the prior held output of the c-bit digital accumulator;

continuing the above steps until the M-bit counter reaches terminal count, which corresponds to $2^{m-1}$ samples; and once the terminal count is reached, examining the output of the c-bit accumulator, and if it has a net positive change in value then incrementing the k-bit accumulator register by 1 to increment the k-bit correction digital-to-analog converter and increase the gain of the fine analog-to-digital converter, and if the c-bit accumulator has a net negative change in value then decrementing the k-bit accumulator register by 1 to decrement the k-bit correction digital-to-analog converter and decrease the gain of the fine analog-to-digital converter.

* * * * *